United States Patent
Yoo et al.

(10) Patent No.: US 8,769,378 B2
(45) Date of Patent: Jul. 1, 2014

(54) CONTROLLER, A METHOD OF OPERATING THE CONTROLLER AND A MEMORY SYSTEM

(75) Inventors: Sung Joo Yoo, Pohang-si (KR); Nam-Wook Kang, Cheongju-si (KR); Chan Ik Park, Hwaseong-si (KR); Hyun Jin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 331 days.

(21) Appl. No.: 13/070,620

(22) Filed: Mar. 24, 2011

(65) Prior Publication Data

US 2012/0216094 A1 Aug. 23, 2012

(30) Foreign Application Priority Data

Feb. 22, 2011 (KR) ........................ 10-2011-0015477

(51) Int. Cl.
*G11C 29/00* (2006.01)
(52) U.S. Cl.
USPC .......................................................... 714/764
(58) Field of Classification Search
None
See application file for complete search history.

(56) References Cited

U.S. PATENT DOCUMENTS

| | | | |
|---|---|---|---|
| 7,389,465 B2 | 6/2008 | Radke et al. | |
| 7,979,737 B2* | 7/2011 | Lin | 714/6.13 |
| 2005/0080986 A1* | 4/2005 | Park | 711/103 |
| 2007/0234143 A1* | 10/2007 | Kim | 714/718 |
| 2007/0277083 A1 | 11/2007 | Van Acht et al. | |
| 2009/0282305 A1* | 11/2009 | Chen et al. | 714/718 |
| 2010/0100763 A1* | 4/2010 | Chen | 714/6 |
| 2010/0162084 A1 | 6/2010 | Coulson et al. | |
| 2010/0235715 A1* | 9/2010 | Thatcher et al. | 714/763 |
| 2010/0287410 A1* | 11/2010 | Li | 714/16 |
| 2011/0161727 A1* | 6/2011 | Lee et al. | 714/6.12 |
| 2011/0185251 A1* | 7/2011 | d'Abreu et al. | 714/752 |
| 2011/0238629 A1* | 9/2011 | Post et al. | 707/674 |
| 2012/0144249 A1* | 6/2012 | Franceschini et al. | 714/54 |

FOREIGN PATENT DOCUMENTS

KR 100842680 B1 6/2008

* cited by examiner

*Primary Examiner* — Albert Decady
*Assistant Examiner* — Enamul M Kabir
(74) *Attorney, Agent, or Firm* — Harness, Dickey & Pierce, P.L.C.

(57) ABSTRACT

The present disclosure provides a controller which comprises a command generator configured to generate a command to non volatile memory, and buffer configured to receive a first data and a second data and configured to combine the first data and the second data, an ECC unit configured to perform the ECC decoding. And the first page data may include at least one error bit corresponding to an error location table and the second page data may include at least one original bit which can be replaced with the error bit. The buffer may replace the at least one error bit with the said at least one original bit. The error location table may save information of location for the repeated error bit.

15 Claims, 14 Drawing Sheets

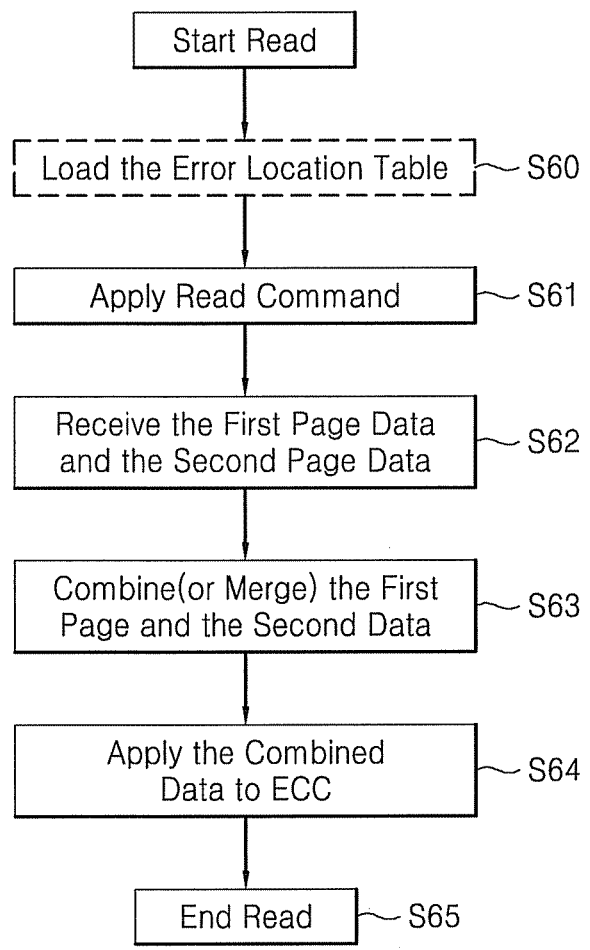

CONTROLLER, A METHOD OF OPERATING THE CONTROLLER AND A MEMORY SYSTEM

CROSS-REFERENCE TO RELATED APPLICATION

This application claims priority under 35 U.S.C. §119(a) from Korean Patent Application No. 10-2011-0015477 filed on Feb. 22, 2011, the disclosure of which is hereby incorporated by reference in its entirety.

BACKGROUND

NAND flash memories, especially MLC (Multi Level Cell) NAND Flash use the spare region to in order to solve reliability problems with high bit error rate. Spare region may include Error Correction Code (ECC) and redundant column which can replace at least error bit cell. In case of MLC NAND Flash, while the memory becomes high capacity such like 3 bits or 4 bits per cell, the bit error rate may be increased. Thus, the memory needs more space region, and the main region capability may be reduced. In case that the error bits which may not be solved with ECC or redundant column, a block having the error may be registered as a bad block. The bad block will not be used any more. Therefore the storage capacity of MLC NAND flash may be reduced.

SUMMARY

According to an exemplary embodiment, a controller comprises a command generator configured to generate a command to non volatile memory, buffer configured to receive a first data and a second data and configured to combine the first data and the second data, an ECC unit configured to perform the ECC decoding, wherein the first page data includes at least one error bit corresponding to an error location table and the second page data includes at least one original bit which can be replaced with the error bit. The buffer may replace the at least one error bit with the said at least one original bit and the error location table saves a location for the repeated error bit.

According to another exemplary embodiment, A method for operating a controller which controls nonvolatile memory comprises a step of applying a read command to non-volatile memory, receiving a first page data and a second page data from the non-volatile memory in response to the read command, combining the first page data and apportion of the second data page referring to a error location table, and performing an ECC decoding using the combined data. The first page data includes at least one error bit corresponding to an error location table and the second page data includes at least one original bit which can be replaced with the error bit. The first page data and the second page data are received from different pages. The combining steps may replace at least one error in the second page with at least the original bit in the second page.

According to another exemplary embodiment, a controller which controls a non volatile memory device, comprises an command generator is configured to generate an read command which is applied to memory device, an ECC unit is configured to receive the first data including at least one error bit corresponding to an error location table and the second data including the first ECC data corresponding to the first page error bit, the ECC unit is configured to correct the first page error bit using the first ECC data. The first ECC may use Reed-Solomon (RS) code and the second ECC may use Bose-Ray-Chaudhuri-Hocquenghem (BCH) code.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 6A shows a flow chart illustrating a method of operating a controller according to an example embodiment.

DETAILED DESCRIPTION OF THE EMBODIMENTS

Figure 1:
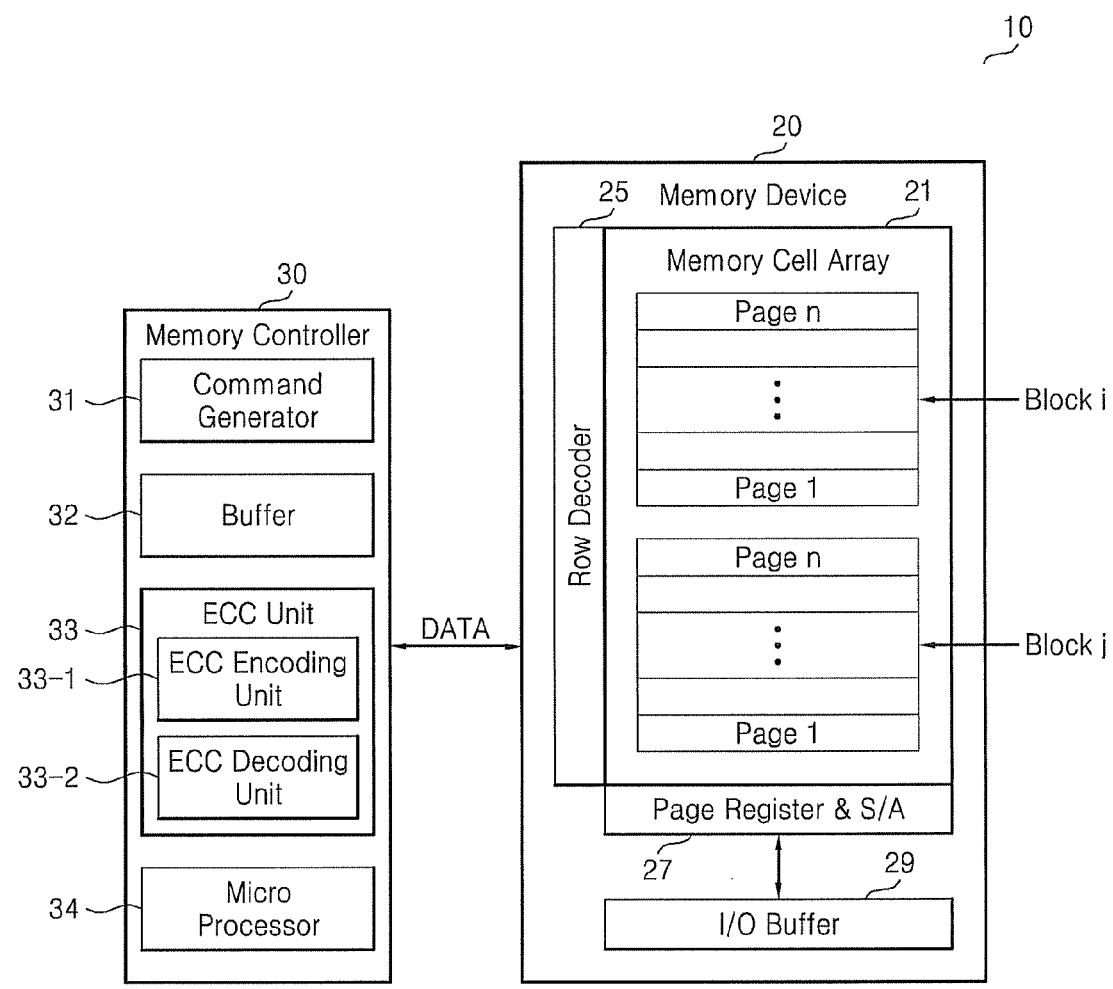
FIG. 1 is a block diagram of a memory system according to an example embodiment.

Detailed example embodiments are disclosed herein. However, specific structural and functional details disclosed herein are merely representative for purposes of describing example embodiments. Example embodiments may, however, be embodied in many alternate fauns and should not be construed as limited to only the embodiments set forth herein.

Accordingly, while example embodiments are capable of various modifications and alternative fauns, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural fauns as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a memory system according to an example embodiment.

Referring to FIG. 1, a memory system 10 generally comprises a memory device 20 and a memory controller 30. The memory device 20 may mean non volatile memory.

The memory device 20 includes a memory cell array 21, a row decoder 25, an access circuit 27, and an input/output (I/O) buffer 29. The memory device 20 may further include other components (not shown) required to communicate (i.e., send and/or receive) data with the controller 30.

Figure 2:
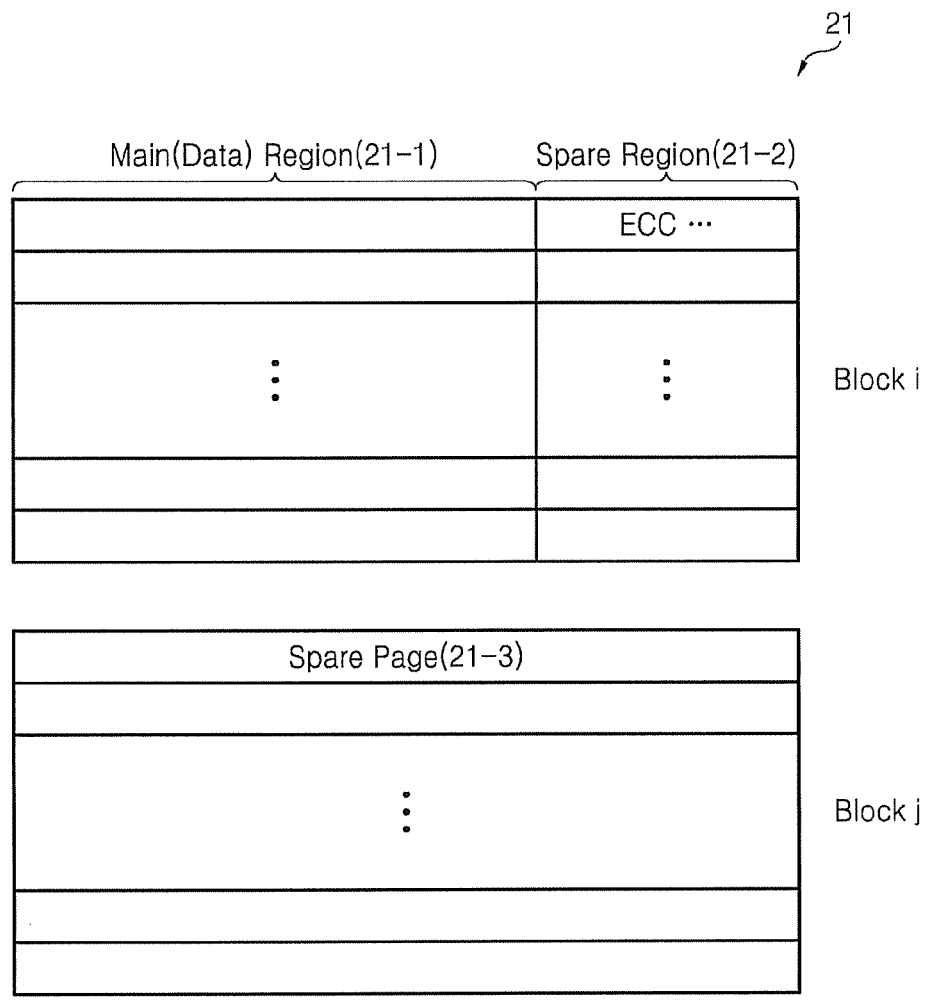
FIG. 2 shows detailed description of memory cell array 21 illustrated in FIG. 1.

The memory cell array 21 of FIG. 1 is divided into a plurality of pages 1 to n, where "n" is a natural number. Each one of the plurality of pages may include a main region and a spare region as shown in FIG. 2. Each main region includes a plurality of word lines, a plurality of bit lines, and a plurality of non-volatile memory cells respectively connected between the word and bit lines and configured to store page data. Each spare region also includes a plurality of word lines, a plurality of bit lines and a plurality of non-volatile memory cells, but the memory cells are configured to store error check bits associated with at least a portion of the page data stored in the corresponding main region.

The plurality of non-volatile memory cells (hereinafter individually or collectively referred to as "the memory cell") incorporated within the memory array 21 may be, for example, Electrically Erasable Programmable Read-Only Memory (EEPROM), NAND flash memory, NOR flash memory, Magnetic RAM (MRAM), Spin-Transfer Torque MRAM, Conductive bridging RAM (CBRAM), Ferroelectric RAM (FeRAM), Phase Change RAM (PRAM), Resistive RAM (RRAM or ReRAM), Nanotube RRAM, Polymer RAM (PoRAM), Nano Floating Gate Memory (NFGM), holographic memory, Molecular Electronics Memory Device or Insulator Resistance Change Memory. Each one of the plurality of non-volatile memory cells may be configured to store a single bit of data or a plurality of bits.

The row decoder 25 is configured to supply at least one voltage to at least one word line among a plurality of word lines in the memory array 21 to execute a program operation, a write operation, a read operation, or an erase operation by decoding a row address received from the memory controller 30. A column decoder (not shown) may similarly supply at least one voltage to at least one bit line among a plurality of bit lines in the memory array 21 to execute the program operation, write operation, read operation or erase operation.

The access circuitry 27 is configured to communicate data between the memory array 21 and the I/O circuit 29 during a page read operation or a page program operation. The access circuitry 27 will generally and as conventionally understood includes a page register (not shown) and a sense amplifier (not shown). The access circuit 27 may perform a program operation or a read operation on page basis using the page register and/or a sense amplifier. In contrast, an erase operation may be performed on block basis, where a block includes a plurality of pages.

The access circuitry 27 is commonly referred to as a page buffer within example embodiments. The I/O buffer 29 is configured to communicate data between the access circuit 27 and the memory controller 30. The access circuit 27 may provide "read data" to the I/O buffer 29 as a result of performing a read operation. Analogously the access circuit 27 may hold "write data" received from the I/O buffer 29 during a program operation. The read data or write data will include a plurality of bits, e.g., a number of bits defined by the page size.

The memory controller 30 may include a command generator 31, an ECC (Error correction code) unit 33, a buffer 32 and microprocessor 34.

A command generator 31 may generate the command applied to memory device 21. A command generator 31 may generate at least one command for memory device to perform read operation, programming operation, or erase operation and apply at least one command to a memory device 21.

An ECC (error correction code) unit 33 may detect an error location among read data from a memory device 21 and may perform the error correction algorithm. ECC unit may include an ECC decoding unit (33-2) and ECC encoding unit (33-1).

An ECC encoding unit (33-1) may encode data to be programmed and form (produce/create) an ECC data (i.e. parity bit) or metadata. ECC data generally may be stored to the spare region (21-2) in FIG. 2.

ECC decoding unit 33-2 may detect the error location and correct the error bit using the ECC data.

A buffer 32 may be volatile memory such as DRAM and include a buffer memory controller. The buffer 32 may store data to be sent to a memory device 20 or data received from memory device 20. The buffer 32 may also combine the data from memory device 21. According to an exemplary embodiment of this invention, the buffer 32 may combine a first page data and a second page data.

A microprocessor (34) may generally control an operation of a memory system 10. The microprocessor control can include, for example, software type of control, such as firmware which can operate under control of the microprocessor 34.

FIG. 2 shows a detailed description of memory cell array 21 illustrated in FIG. 1. Referring to FIG. 1 and FIG. 2, block i includes a plurality of pages and each page includes a main data region 21-1 and a spare region 21-2. A main data region may store main data received from a memory controller 30. The page having main data 22-1 may perform the read operation and programming operation ("first page").

In case of a MLC (multi level cell), bit error rates may be increased while the number of bits to be programmed to one cell is increased. Therefore an unrecoverable error bit may occur even if memory device 20 uses spare region 21-2. When the unrecoverable error bit occurs in memory device 20, that block may be designated as a bad block, and the bad block may not be used any more. In that case, a capability of memory storage may be reduced. Accordingly, example embodiments may be used to correct the error bit which repeatedly occurs using a different method from spare region 21-2.

Figure 3A:
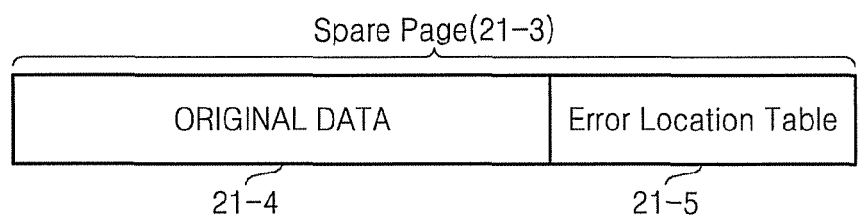
FIGS. 3a and 3b illustrate a configuration of spare page.

FIG. 3a illustrates spare page 21-3. Spare page 21-3 (or second page) may store an error location table. An error location table may include information of memory cell's location which may produce the repeatedly occurring error bits ("error location").

Spare page 21-3 (or second page) may have a different page address from the address of read command received page ("first page") and be located in a same block including the read page or different block from the block including the read page.

Referring to FIG. 3a, spare page 21-3 may store an original data 21-4 which can be used to replace the error bits found in the location corresponding to the error bit location table 21-5. Thus the error bits are corrected.

Figure 3B:
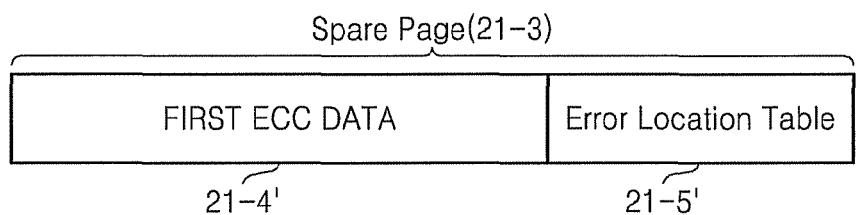
Figure 4:
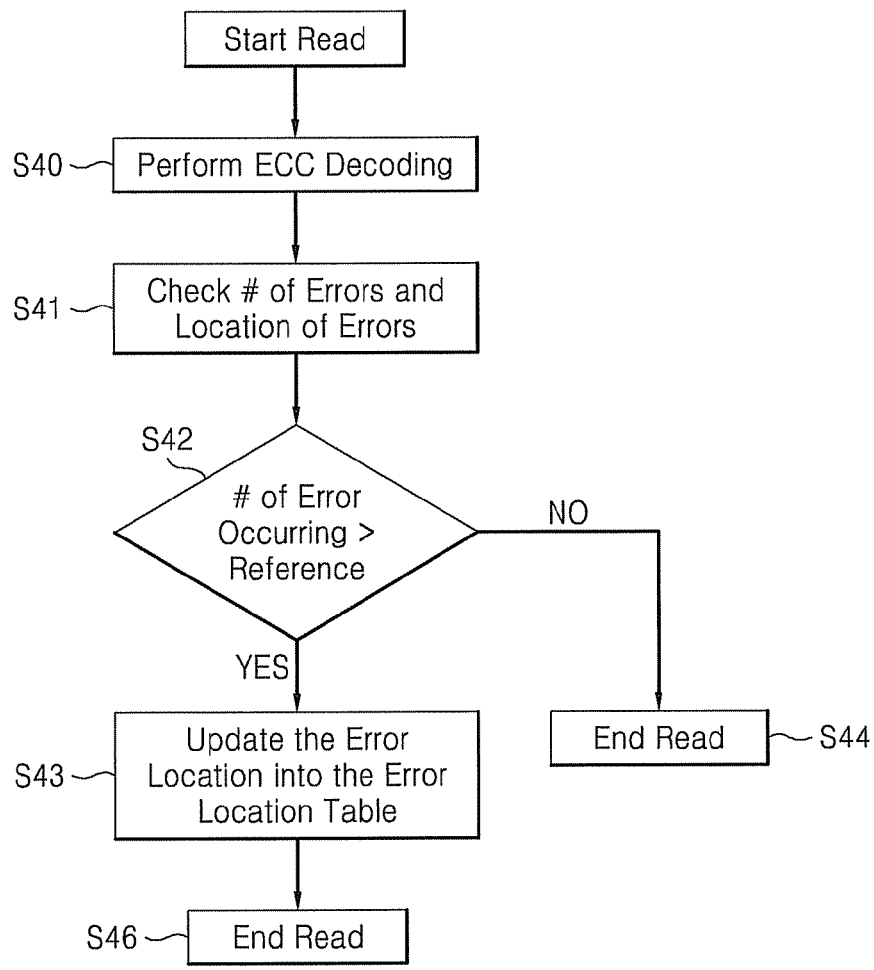
FIG. 4 shows a flow chart which describes the process of creating an error location table.

Referring to FIG. 3b, spare page 21-3 may alternatively store ECC data 21-4' corresponding to the error bits corresponding error location table. ("the first ECC data"; 21-4'). Thus the error bits corresponding to the error location table may be corrected using the first data. FIG. 4 shows a flow chart which describes the process of making an error location table.

Referring to FIG. 1 through FIG. 4, memory controller 30 may apply a read command to memory device 20. In response to the read command, memory controller 30 may receive data from the memory device 20. ECC decoding unit 33-2 may perform ECC decoding to check whether the data received from memory device includes an error (S40), and check the error location and number (S41).

If the data includes an error bit, microprocessor 34 may compare the number of error bits occurring in the specific location with a reference number (S42).

If the number of error bits occurring is smaller than the reference number, information that includes a location of the error bit and the number of times the error bits occurs is stored in the spare region 21-2 or spare page 21-3 under control of microprocessor 34. Then the read operation is finished (S44).

But, if the number of error bit occurring is bigger than the reference number, the location of the error bit is stored to an error location table under control of microprocessor 34 (S43), and the error location table is stored in the spare page 21-3. Then the read operation is finished (S46).

In other words, whenever the read operation is performed in response to the read command, the microprocessor stores the error bit location and the number of error bits occurring associated with the error bit location, and compares the number of error bits occurring with the reference number. The location where the number of repeatedly occurring error bits is more than the reference number is updated to the error location table. The updated error location table may be stored to the spare page 21-3 under control of microprocessor 34. The error location table can be used as an index for finding the repeated error bit, or a location at which error bits are experienced repeatedly, and provide with the location of the repeated error bits.

Figure 5:
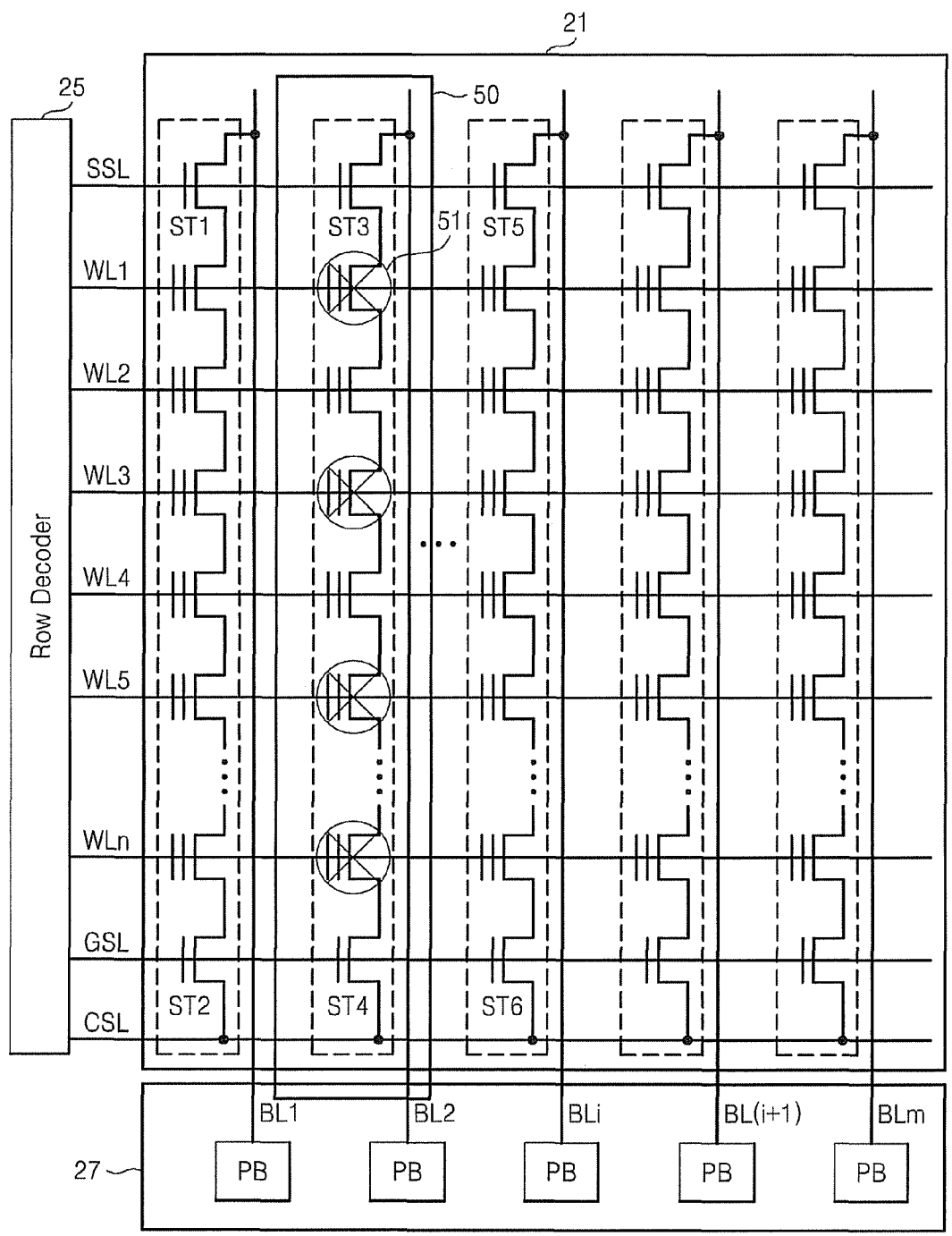
FIG. 5 shows the error bit location corresponding to the error location table.

Referring to FIG. 5, the error location table may identify locations of error bits in a string of the same column. The same column may have a plurality of memory cells connected to one bit line 50. The mark 'X' 51 indicates the error bit locations in the same column. In this case, the error location table may store the error bit locations of the error bits in the same column.

FIG. 6A shows a flow chart illustrating a method of operating a controller according to an example embodiment.

Referring to FIG. 6A, memory controller 30 may apply a read command to memory device 21 (S61). In response to the read command, memory device 21 may perform the read operation, and memory controller 30 may receive the first page data and the second page data (S62). The first page data may include at least one error bit corresponding to error location table 21-5. And the second page data may include original data 21-4 which can be used to replace the error bits found in the location corresponding to the error bit location table 21-5. The second page may be spare page. The first page and second page are different pages which may be located in the same block or different block.

The memory controller 30 may store the received first page data and second page data in the buffer 32. And the buffer 32 is configured to combine the first page data and the second page data through the replacement. Therefore the first page data and the second page data can be combined in the buffer 32 and the combined first page data may be formed (S63). Thus the error bits corresponding to the error location table may be corrected.

The combined first page data may include error bits which are not corresponding to the error location table. Therefore, ECC unit 33 may perform ECC decoding for combined first page (S64). At that time, BCH code, for example, may be used for ECC decoding, but, it is not limited to BCH code.

After ECC decoding, the read operation is finished (S65).

This embodiment can improve the error correction capability for the read operation page. For example, assume that said ECC capability is 20 bit and there are 5 error bits corresponding to the error location table, memory controller 30 may correct up to 25 bits when memory controller 30 uses the original data in the spare page 71.

Figure 7:
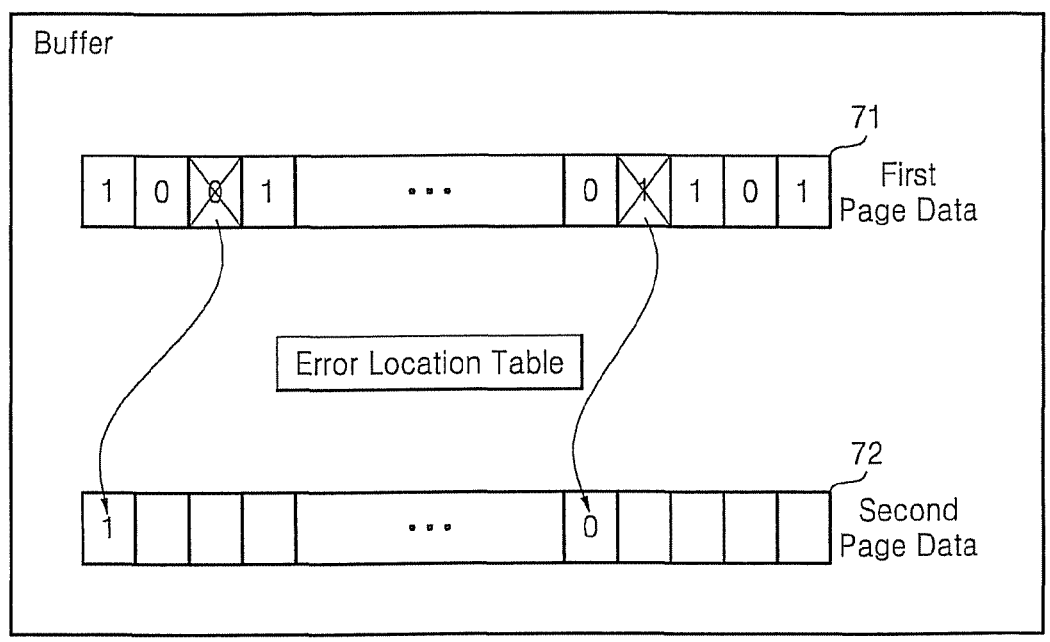
FIG. 7 shows a combing process based on 6A.

Referring to FIG. 7, the buffer 32 replaces the error bits in the first page data with the original data in the second page data 72 referring to the error location table.

Referring to S60, the error location table is loaded before applying the read command. However, this is only one example, and different arrangements are possible. For example, the error location table can be loaded after applying read command (S61), or after receiving data (S62).

If there is no error bit corresponding to the error location table, ECC decoding is performed for the received first data and the read operation is finished (not shown).

Figure 6B:
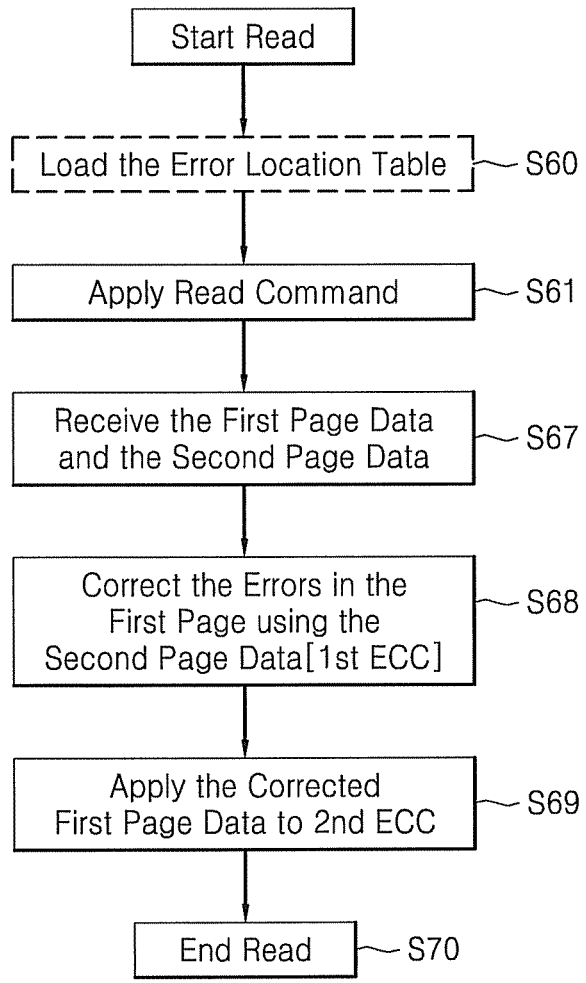
FIG. 6B is a flow chart illustrating a method operating a controller including use of additional ECC data according to an example embodiment.

FIG. 6B shows a flow chart illustrating a method of operating a controller including us of additional ECC data according to example embodiments.

Referring to FIG. 6B, steps S60 and S61 are the same as FIG. 6A.

Referring to S67, memory controller 30 may receive the first page data and the second page data in response to the read command. The first page data includes at least one error bit corresponding to the error location table same as FIG. 6a. Further, the second page data may include the first ECC data corresponding to at least one error bit in the first page. The second page data can be stored in the spare page. Same as FIG. 6A, the first page and the second page are different pages which may be located in the same block or different block.

Figure 8:
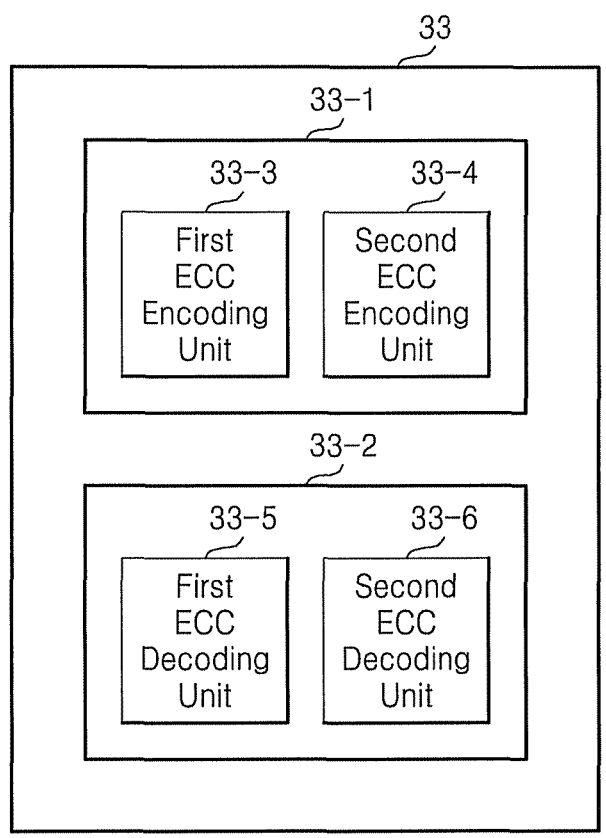
FIG. 8 shows block diagram of ECC unit 33 based on FIG. 6B.

FIG. 8 shows block diagram of ECC unit 33 based on FIG. 6b. The ECC unit 33 may be divided to two parts, ECC encoding unit 33-1 and ECC decoding unit 33-2. The ECC decoding unit 33-2 may be divided to two parts, first ECC decoding unit 33-5 and the second ECC decoding unit 33-6.

According to FIG. 8, the first ECC encoding unit (33-3) performs error correction encoding the data corresponding to the error location table among the data from a outside host via host I/O. And the first ECC encoder (33-3) forms the data added the parity bit. The data comprising parity bit may be stored to the second page of memory device (20).

According to FIG. 8, the first decoding unit (33-5) performs the error correction decoding the data corresponding to error location table. The first decoding unit decide whether error correction is passed or failed according to a decoding result. And the first decoding (33-5) unit may correct the error bits using the parity bit.

According to FIG. 8, the second ECC encoding unit (33-4) performs error correction encoding the data, which are not related to the error location table among the data from a outside host via host I/O. And the second ECC encoding unit (33-4) forms the data added the parity bit. The data comprising parity bit may be stored to the spare area of the first page or the second page of memory device (20).

According to FIG. 8, the second decoding unit (33-6) performs the error correction decoding the data which are not related to the error location table. The second decoding unit (33-6) may decide whether error correction is passed or failed according to the decoding result. And the second decoding unit may correct the error bits using the parity bit.

According to FIG. 8, the ECC unit (33) may include the circuitry, system, or device in order to correct the error bit.

Referring to FIG. 6b and FIG. 8, ECC unit 30 may receive the first page data and the second page data. As mentioned before, the second page data may include the first ECC data and the first ECC decoding unit 33-5 may perform ECC decoding using the first ECC data ("first ECC decoding"). And the first page error bit corresponding to the error location table may be corrected.

The first ECC decoding may use, for example, RS code, turbo code, Convolution code. But, it is not limited to these one.

Referring to S68, the error bits corresponding to the error location table may be corrected. But, the error bits which are not corresponding to the error location table are not corrected. Accordingly, the first page data corrected using first ECC decoding in S68 goes to the second ECC decoding unit 33-6. The second ECC decoding unit may correct error bits in the corrected first page data (S69). The second ECC decoding may use BCH code which may be useful for the randomly occurred error bits. But, it is not limited.

And the read operation is finished after second ECC decoding.

By using the first ECC data corresponding to error location table which may include the information of repeated error bits, error correction capability may be dramatically improved and prevent an overload of ECC unit 33. The first ECC data may occupy smaller space than the original data. It may help keep storage capability of non volatile memory.

The memory controller 30 may store the original data and the first ECC data in the second page (spare page) and use either method among two methods. For example, when the number of repeated error bits is big, the memory controller 30 may correct the error bits using the first ECC data. On the other hand, when the number of repeated error bits is small, the memory controller 30 may replace error bits with the original data stored in the second page and correct the error bits.

Figure 9:
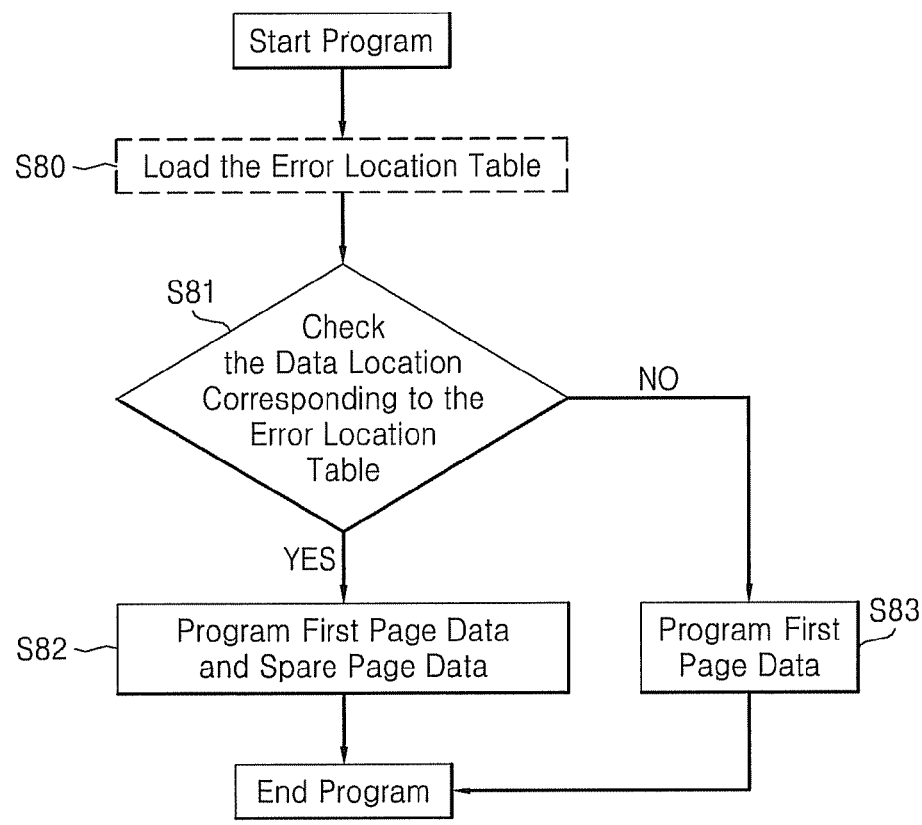
FIG. 9 illustrates a flow chart illustrating a method programming the original data or first ECC data according to an example embodiment.

FIG. 9 illustrates a flow chart of programming the original data or first ECC data. Microprocessor 34 may make (set up) the error location table which may include information of repeated error bits while the read operation is performed.

Memory controller 30 may generate and apply the program command to memory device 32 on a page basis. Memory controller 30 may load the error location table (S80) and check whether there are the data and data location corresponding to error location table among data to be programmed (S81). If there is no error bit data corresponding to error location table, memory controller 30 apply the program command to the first page in the memory device (S83). And after the first page data programming, program operation is finished. The first page data is data to be programmed to memory device 32.

If the error bit location is found, memory controller 30 makes the original data corresponding to the error location table programmed in the second page (or spare page). The first page data means data to be programmed to memory device 32. Or the first ECC unit 33-3 performs the first ECC encoding using the data corresponding to the error location table, and memory controller 30 may order the first ECC data to be programmed in the second (spare) page (S82). And both the first page data and the second page data are programmed and then program operation is finished. As mentioned before, the first page and the second page are physically different pages.

Figure 10:
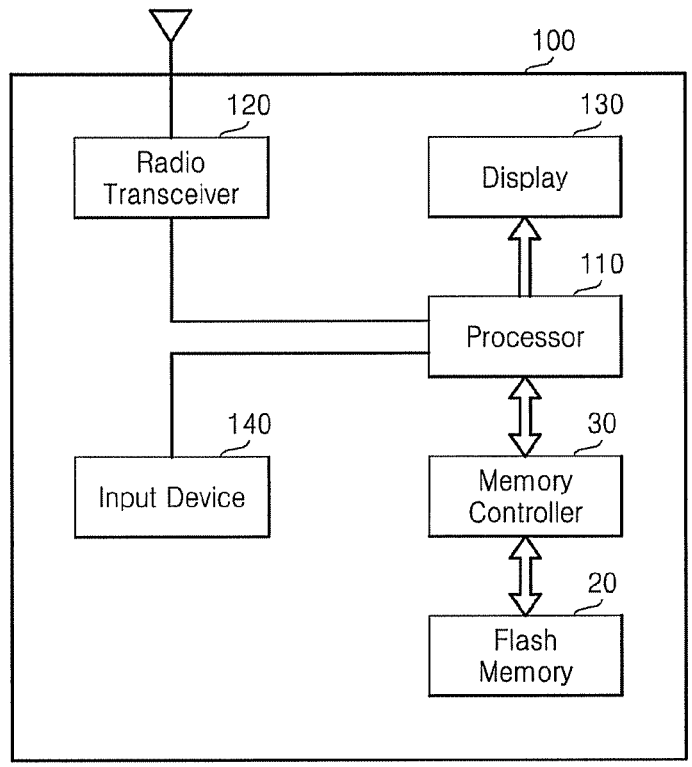
FIG. 10 shows a block diagram of an electronic device including the non-volatile memory device according to an example embodiment of the present invention.

FIG. 10 shows a block diagram of an electronic device including the non-volatile memory device according to an example embodiment of the present invention.

Referring to FIG. 10, an electronic device 100, for example, a cellular phone, a smart phone or a tablet PC may include a non-volatile memory device 20, which may be embodied in a flash memory device, and a memory controller 30, which may control an operation of the non-volatile memory device 20.

The non-volatile memory device 20 and memory controller 30 illustrated in FIG. 10 may be the non-volatile memory device 20 and memory controller 30 illustrated in FIG. 1. The memory controller 30 is controlled by a processor 110 controlling a whole operation of an electronic device 190.

Data stored in the non-volatile memory device 20 may be displayed through a display 130 according to a control of the memory controller 30 operating according to a control of the processor 110.

A wireless transceiver 120 may transmit or receive a wireless signal through an antenna ANT. For example, the wireless transceiver 120 may convert a received wireless signal received through the antenna ANT to a signal which the processor 110 may process. Accordingly, the processor 110 may process a signal output from the wireless transceiver 120, and store a processed signal in the non-volatile memory device 20 through the memory controller 30 or display the processed signal through the display 130.

The wireless transceiver 120 may convert a signal output from the processor 110 to a wireless signal and output a converted wireless signal to the outside through the antenna ANT.

An input device 140 is a device which may input a control signal for controlling an operation of the processor 110 or data to be processed by the processor 110, and it may be embodied in a pointing device such as a touch pad and a computer mouse, a keypad or a keyboard.

The processor 110 may control the display 130 so that display data output from the non-volatile memory device 20, a wireless signal output from the wireless transceiver 120 or data output from the input device 140 may be displayed through the display 130.

Figure 11:
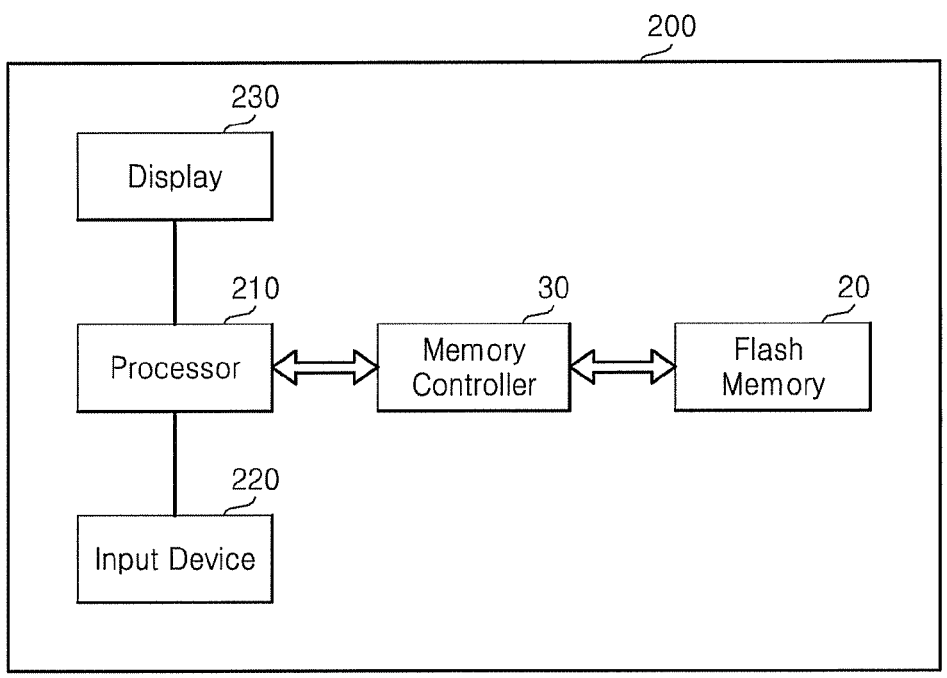
FIG. 11 shows a block diagram of an electronic device including a non-volatile memory device according to another example embodiment of the present invention.

FIG. 11 shows a block diagram of an electronic device including a non-volatile memory device according to another example embodiment of the present invention.

Referring to FIG. 11, an electronic device 200, which may be embodied in a data processing device, for example a personal computer PC, a tablet computer, a net-book, an e-reader, a personal digital assistant, a portable multimedia player, a MP3 player or a MP4 player, includes a non-volatile memory device 20 such as a flash memory device and a memory controller 30 controlling an operation of the non-volatile memory device 20. The non-volatile memory device 20 and memory controller 30 illustrated in FIG. 11 may be the non-volatile memory device 20 and memory controller 30 illustrated in FIG. 1.

The electronic device 200 may include a processor 210 for controlling a whole operation of the electronic device 200. The memory controller 250 is controlled by the processor 210.

The processor 210 may display data stored in the non-volatile memory device 20 through the display 230 according to an input signal generated by the input device 220. For example, the input device 220 may be embodied in a pointing device such as a touch pad or a computer mouse, a keypad or a keyboard.

Figure 12:
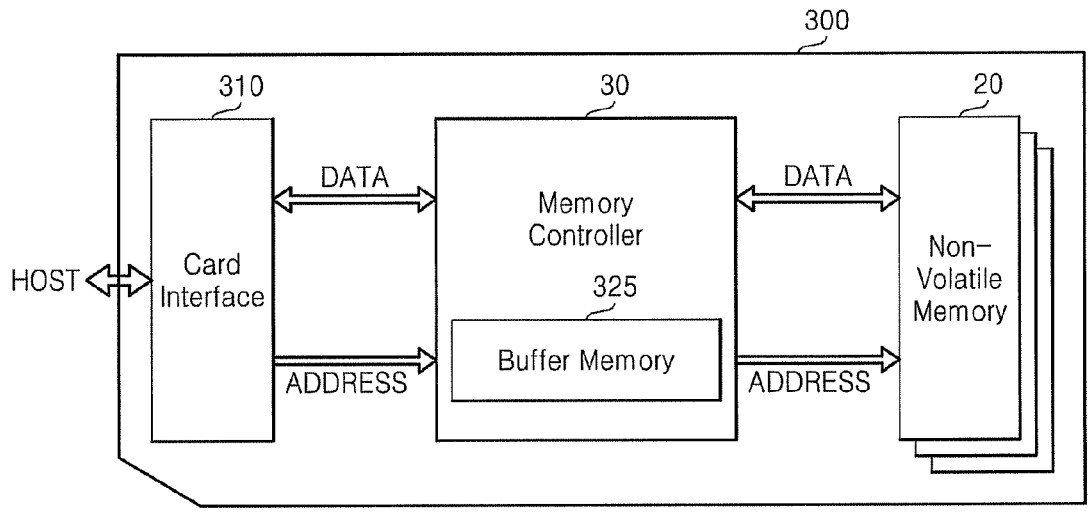
FIG. 12 shows a block diagram of an electronic device including a non-volatile memory device according to still another example embodiment of the present invention.

FIG. 12 shows a block diagram of an electronic device including a non-volatile memory device according to still another example embodiment of the present invention.

Referring to FIG. 12, an electronic device 300 includes a card interface 310, a memory controller 30 and a non-volatile memory device 20, e.g., a flash memory device. The non-volatile memory device 20 and memory controller 30 illustrated in FIG. 12 may be the non-volatile memory device 20 and memory controller 30 illustrated in FIG. 1.

The electronic device 300 may transmit or receive data with a host through the card interface 310. According to an example embodiment, the card interface 310 may be a secure digital (SD) card interface or a multi-media card (MMC) interface, however, it is not restricted thereto. The card interface 310 may interface a data exchange between the host and the memory controller according to a communication protocol of the host which may communicate with the electronic device 300.

The memory controller 320 may control a general operation of the electronic device 30 and control a data exchange between the card interface 310 and the non-volatile memory device 20. In addition, a buffer memory 325 of the memory controller may buffer data exchanged between the card interface 310 and a non-volatile memory device 330.

The memory controller 30 is connected to the card interface 310 and a non-volatile memory device 60 through a data bus and an address bus. According to an example embodiment, the memory controller 30 receives an address of data to read or to write from the card interface 310 through the address bus and transmits it to the non-volatile memory device 20.

In addition, the memory controller 30 receives or transmits data to read or to write through a data bus connected to each of the card interface 310 and the non-volatile memory device 20. When an electronic device 300 of FIG. 12 is connected to a PC, a tablet PC, a digital camera, a digital audio player, a cellular phone, a console video game hardware or a host such as a digital set-top box, the host may transmit or receive data stored in the non-volatile memory device 20 through the card interface 310 and the memory controller 30.

Figure 13:
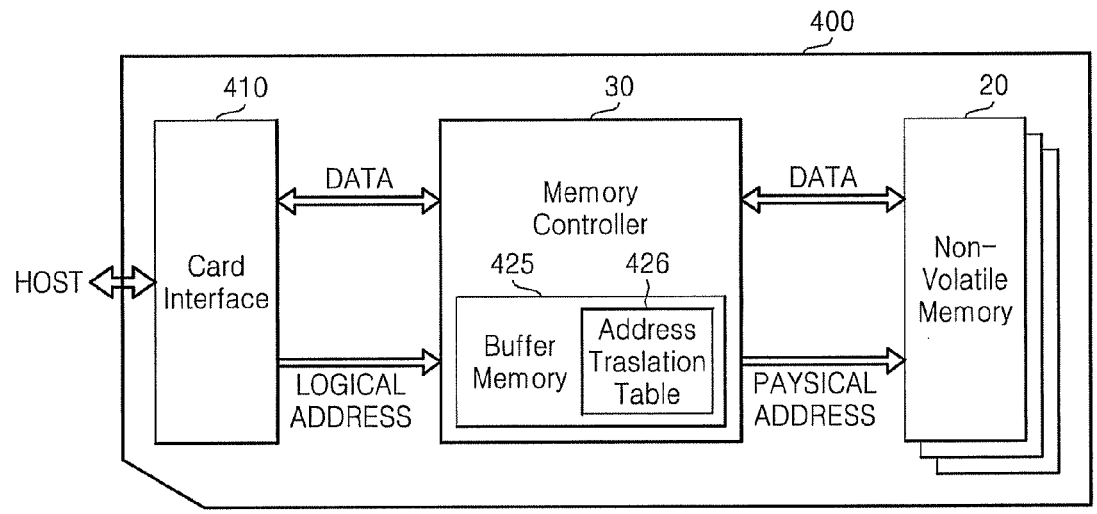
FIG. 13 shows a block diagram of an electronic device including a non-volatile memory device according to still another example embodiment of the present invention.

FIG. 13 shows a block diagram of an electronic device including a non-volatile memory device according to still another example embodiment of the present invention.

Referring to FIG. 13, an electronic device 400 includes a card interface 410, a memory controller 30 and a non-volatile memory device 20, e.g., a flash memory. The non-volatile memory device 20 and memory controller 30 illustrated in FIG. 13 may be the non-volatile memory device 20 and memory controller 30 illustrated in FIG. 1.

An electronic device 400 may perform a data communication with a host through a card interface 410. According to an example embodiment, the card interface 410 may be a SD card interface or a MMC interface, however, it is not restricted thereto. The card interface 410 may perform a data communication between a host and a memory controller 30 according to a communication protocol of a host which may communicate with the electronic device 400.

The memory controller 30 may control a general operation of the electronic device 400 and control a data exchange between the card interface 410 and the non-volatile memory device 20.

Moreover, a buffer memory 425 included in the memory controller 30 may store various data to control a general operation of the electronic device 400. A buffer memory in the memory controller 30 may be connected to the card interface 410 and the non-volatile memory 20 through a data bus and a logical address bus.

According to embodiments, the memory controller 30 may receive an address of a read data or a write data from the card interface 410 through a logical address bus, and transmit it to the non-volatile memory device through a physical address bus.

Additionally, the memory controller 30 may receive or transmit a read data or a write data through a data bus connected to each of the card interface 410 and a non-volatile memory 60. According to embodiments, the memory controller 30 of the electronic device 400 may include an address translation table 426 in a buffer memory 425. In the address translation table, a logical address input from outside and a logical address for accessing to the non-volatile memory 20 may be included. During a write operation, the memory controller 30 may write a new data in a certain physical address and update the address translation table.

The memory controller 30 may select a physical address performing a read operation as well as a write operation from the address translation table 426 by referring to a physical address of data where a write operation is performed.

The memory controller 30 may perform the write operation and the read operation at the same time and update the address translation table 426 according to the write operation and the read operation. Accordingly, an operation time of the electronic device 400 may be reduced.

When the electronic device 400 of FIG. 13 is connected to a PC, a tablet PC, a digital camera, a digital audio player, a cellular phone, a console video game hardware or a host such as a digital set-top box, the host may transmit or receive data stored in the non-volatile memory 20 through the card interface 410 and the memory controller 420.

Figure 14:
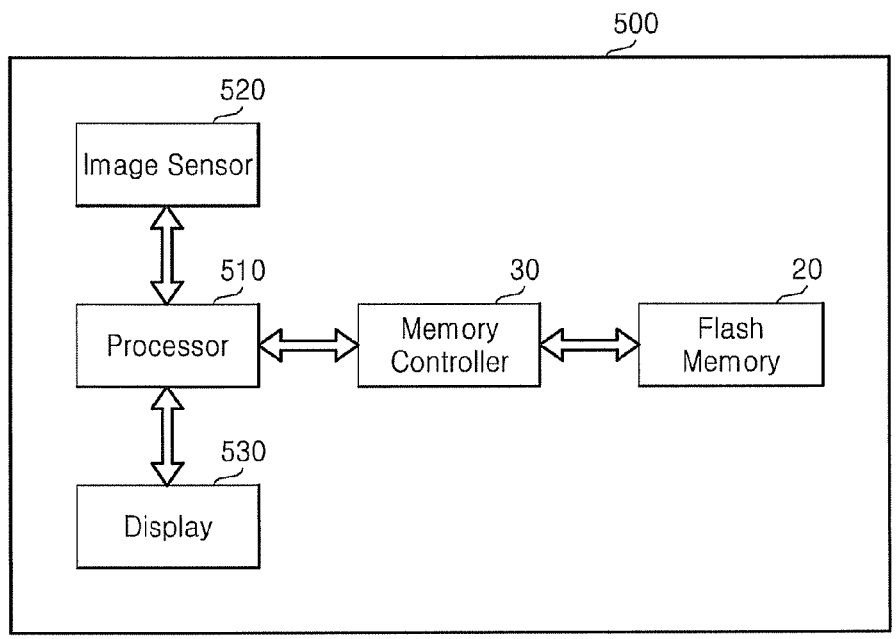
FIG. 14 shows a block diagram of an electronic device including a non-volatile memory device according to still another example embodiment of the present invention.

FIG. 14 shows a block diagram of an electronic device including a non-volatile memory device according to still another example embodiment of the present invention.

Referring to FIG. 14, an electronic device 500 includes a non-volatile memory device 20 such as a flash memory device, a memory controller 30 for controlling a data processing operation of the non-volatile memory device 20, and a processor 510 controlling a general operation of the electronic device 500. The non-volatile memory device 20 and memory controller 30 illustrated in FIG. 14 may be the non-volatile memory device 20 and memory controller 30 illustrated in FIG. 1.

An image sensor 520 of the electronic device 500 converts an optical signal into a digital signal, and is stored in the non-volatile memory device 20 or displayed through the display 530 under a control of the processor 510. In addition, a digital signal stored in the non-volatile memory device 20 is displayed through the display 530 under a control of the processor 510.

Figure 15:
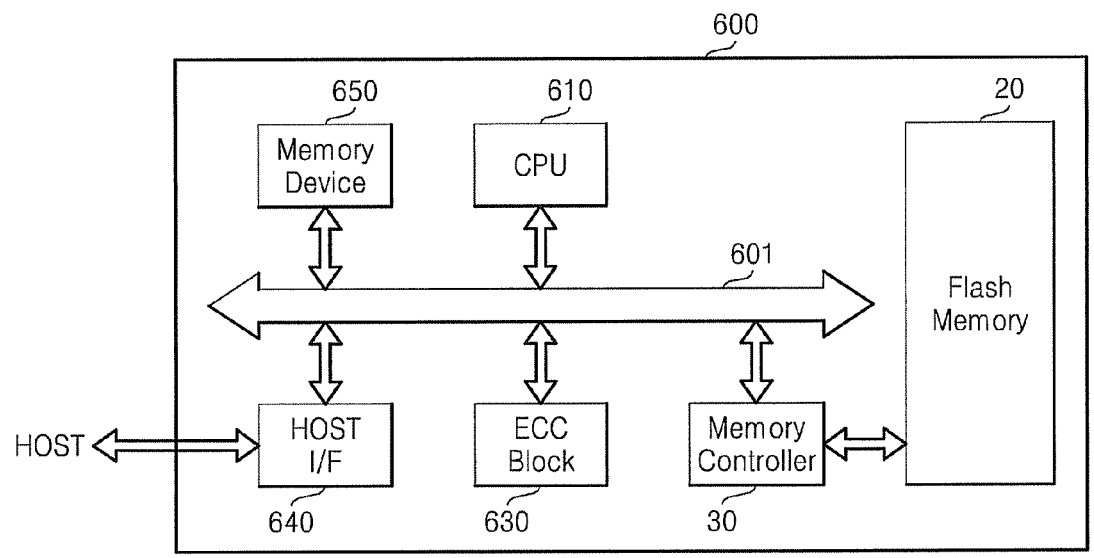
FIG. 15 shows a block diagram of an electronic device including a non-volatile memory device such as a flash memory device according to still another example embodiment of the present disclosure.

FIG. 15 shows a block diagram of an electronic device including a non-volatile memory device such as a flash memory device according to still another example embodiment of the present invention.

Referring to FIG. 15, an electronic device 600 includes a non-volatile memory device 20 such as a flash memory device, a memory controller 30 for controlling an operation of the non-volatile memory device 20, and a CPU 610 controlling a general operation of the electronic device 600. The non-volatile memory device 20 and memory controller 30 illustrated in FIG. 10 may be the non-volatile memory device 20 and memory controller 30 illustrated in FIG. 1.

The electronic device 600 includes a memory 650 which may be used as an operation memory of the CPU 610. The memory 650 may be embodied in a non-volatile memory such as a ROM or a volatile memory such as a DRAM.

A host connected to the electronic device 600 may transmit or receive data to/from the non-volatile memory device 20 through the memory controller 30 and a host interface 640. Here, the memory controller 30 may perform a function of a memory interface, e.g., a flash memory interface. The memory controller 650 may determine if a read operation on data initially output from the memory cell array 21 during a current read operation is successful, and change a read parameter necessary for a next read operation in advance even though the read operation is successful.

The electronic device 600 according to embodiments may further include an error correction code (ECC) block 630. The ECC block 630 operating according to a control of the CPU 610 may detect and correct an error included in data read from the non-volatile memory device 20 through the memory controller 650.

The CPU 610 may control a data exchange among the memory controller 650, the ECC block 630, the host interface 640 and a memory 650.

The electronic device 600 may be embodied in a universal serial bus (USB) memory drive or a memory stick.

Figure 16:
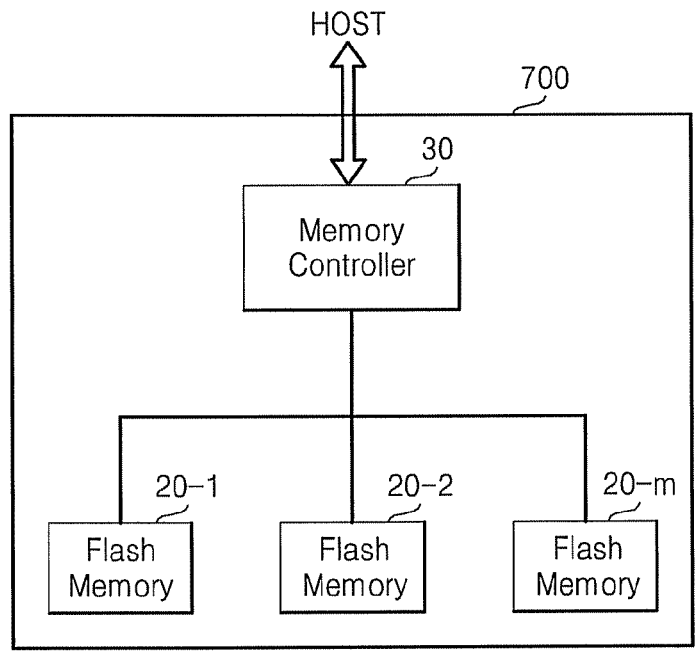
FIG. 16 shows a block diagram of an electronic device including a non-volatile memory device according to still another example embodiment of the present invention.

FIG. 16 shows a block diagram of an electronic device including a non-volatile memory device according to still another example embodiment of the present invention.

Referring to FIG. 16, an electronic device 700 may be embodied in a data storage device such as a solid state drive (SSD).

The electronic device 700 may include a plurality of non-volatile memory devices 20-1 to 20-$j$ and a memory controller 30 controlling a data processing operation of each of the plurality of non-volatile memory devices 20-1 to 20-$j$. The non-volatile memory device 20-1 to 20-$j$ illustrated in FIG. 16 may be the same as the non-volatile memory device 20 illustrated in FIG. 1, and the memory controller 30 illustrated in FIG. 16 may be the same as the memory controller 30 illustrated in FIG. 1.

The electronic device 700 may be embodied in a memory system or a memory module. According to embodiments, the memory controller 30 may be embodied inside or outside the electronic device 700.

Figure 17:
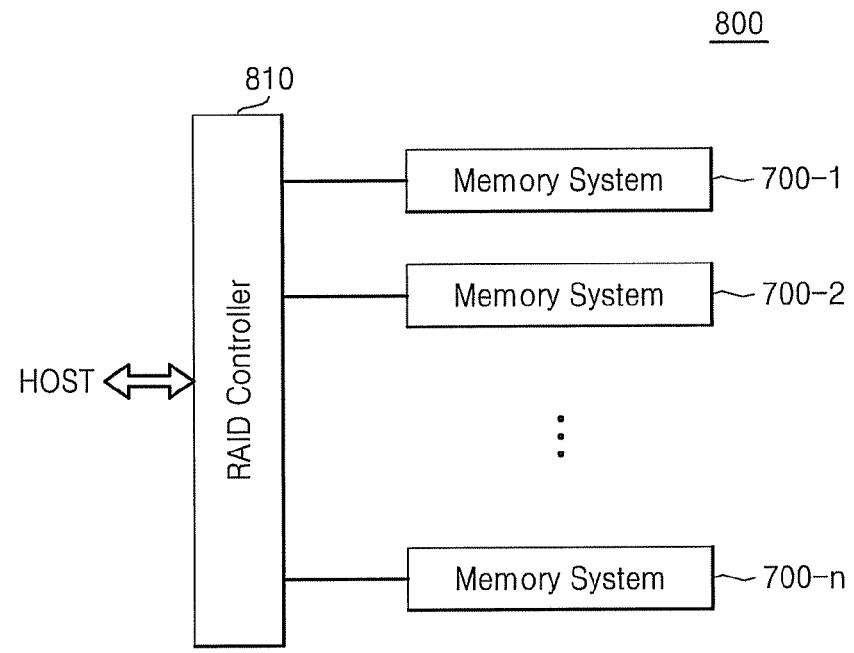
FIG. 17 shows a block diagram of a data processing system including an electronic device illustrated in FIG. 16.

FIG. 17 shows a block diagram of a data processing system including an electronic device illustrated in FIG. 16.

Referring to FIGS. 16 and 17, a data storage device 800 which may be embodied in a redundant array of independent disks (RAID) system may include a RAID controller 810 and a plurality of memory systems 700-1 to 700-$n$, where n is a natural number.

Each of the plurality of memory systems 700-1 to 700-$n$ may be an electronic device 700 illustrated in FIG. 19. The plurality of memory systems 700-1 to 700-$n$ may compose a RAID array. The data storage device 800 may be embodied in a personal computer (PC) or a SSD.

During a program operation, the RAID controller 810 may output a program data output from a host to one of the plurality of memory systems 700-1 to 700-$n$ according to one of a plurality of RAID levels selected based on a RAID level information output from the host.

Additionally, during a read operation, the RAID controller 810 may transmit data read from one of the plurality of memory systems 700-1 to 700-$n$ to the host according to one of a plurality of RAID levels selected based on a RAID level information output from the host.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method for operating a controller which controls non-volatile memory comprising:
   applying a read command to non-volatile memory;
   receiving, from the non-volatile memory, first page data read from a first page of the non-volatile memory and second page data read from a second page of the non-volatile memory in response to the read command, the second page data including original data and an error location table including error location information corresponding to the first page data; and
   combining the first page data and at least a portion of the original data based on the error location information,
   wherein the first page data includes at least one error bit corresponding to a location in the error location information, and
   the second page data includes at least one original bit corresponding to the at least one error bit.

2. The method of claim 1, further comprising:
   performing an Error Correction Code (ECC) decoding using the combined data.

3. The method of claim 1, wherein first page data and the second page data are received from different pages.

4. The method of claim 1, wherein the error location information includes a location of a repeated error bit.

5. The method of claim 1, wherein the combining step includes replacing at least one error in the first page data with at least the original bit in the second page data.

6. The method of claim 2, wherein the ECC decoding uses Bose-Ray-Chaudhuri-Hocquenghem (BCH) code.

7. A controller comprising:
a command generator configured to generate a read command for a non-volatile memory that causes the non-volatile memory to read first page data from a first page of the non-volatile memory and second page data from a second page of the non-volatile memory; and
a buffer configured to receive the first page data and the second page data, the second page data including original data and an error location table including error location information corresponding to the first page data, the buffer being configured to combine the first page data and at least a portion of the original data based on the error location information,
wherein the first page data includes at least one error bit corresponding to a location in the error location information, and
the second page data includes at least one original bit corresponding to the at least one error bit.

8. The controller of claim 7, further comprising:
an ECC unit configured to perform Error Correction Code (ECC) decoding on the combined data.

9. The controller of claim 7, wherein the buffer is configured to replace the at least one error bit of the first page data with the at least one original bit of the original data.

10. The controller of claim 7, wherein the error location information includes a location of a repeated error bit.

11. A method for operating a controller comprising:
applying a read command to non-volatile memory;
receiving a first page data including at least one error bit, and a second page data corresponding to the first page data from the non-volatile memory in response to the read command, the first page data being data read from a first page of the non-volatile memory device, the second page data begin data read from a second page of the non-volatile memory device, the second page data including an error location table including error location information and a first Error Correction Code (ECC) data, the first ECC data and a location in the error location information corresponding to the at least one error bit; and
correcting the first page data by performing a first ECC decoding on the at least one error bit using the first ECC data and the error location information.

12. The method of claim 11, further comprising:
performing a second ECC decoding for the corrected first page data.

13. The method of claim 11, wherein the error location table includes a location corresponding to a repeated error bit.

14. The method of claim 11, wherein the first page data and the second page data are received from different pages.

15. The method of claim 11, wherein the first ECC decoding is performed using Reed-Solomon (RS) code and the second ECC decoding is performed using Bose-Ray-Chaudhuri-Hocquenghem (BCH) code.

* * * * *